(12) United States Patent
Vienot et al.

(10) Patent No.: US 9,523,710 B2
(45) Date of Patent: Dec. 20, 2016

(54) ELECTRICAL COMPONENT TESTING NEST

(71) Applicant: ISMECA SEMICONDUCTOR HOLDING SA, La Chaux-de-Fonds (CH)

(72) Inventors: Sylvain Vienot, Villers-le-Lac (FR); Phillipe Viverge, Le Russey (FR); Massimo Scarpella, Les Brenets (CH); Philippe Roy, Gilley (FR)

(73) Assignee: ISMECA SEMICONDUCTOR HOLDING SA, La Chaux-de-Fonds (CH)

( * ) Notice: Subject to any disclaimer, the term of this patent is extended or adjusted under 35 U.S.C. 154(b) by 32 days.

(21) Appl. No.: 14/369,189

(22) PCT Filed: Dec. 5, 2012

(86) PCT No.: PCT/EP2012/074397
§ 371 (c)(1),
(2) Date: Jun. 26, 2014

(87) PCT Pub. No.: WO2013/117265
PCT Pub. Date: Aug. 15, 2013

(65) Prior Publication Data
US 2014/0375323 A1    Dec. 25, 2014

(30) Foreign Application Priority Data

Feb. 10, 2012 (CH) .................................. 186/12

(51) Int. Cl.
*G01R 31/00* (2006.01)
*G01R 1/04* (2006.01)
(Continued)

(52) U.S. Cl.
CPC ......... *G01R 1/0408* (2013.01); *G01R 31/2635* (2013.01); *G01R 31/2893* (2013.01); *G01R 31/2865* (2013.01)

(58) Field of Classification Search
CPC ..... H05B 37/036; G01R 31/44; G01R 31/041; G01R 1/048; G01R 31/2615; G01R 1/0483; G01R 1/0466; G01R 31/2863; G01R 31/2893; G01R 1/0433; G01R 1/0735; G01R 21/133; G01R 31/2886; G01R 19/14; G01R 31/02; G01R 31/2635; G01R 31/3272; G01R 1/073; G01N 21/3151; H01L 27/14618; H01L 24/85; H01L 2224/81; H01L 2224/81193; H01L 24/81; H01L 33/62; H01L 23/32; H01R 13/6683; H01R 31/02; H01R 33/945; H01R 43/052; H04B 1/44; H04B 3/544
See application file for complete search history.

(56) References Cited

U.S. PATENT DOCUMENTS 5,469,074 A * 11/1995 Drabenstadt ......... G01R 1/0433
324/756.02
5,578,870 A * 11/1996 Farnsworth .......... G01R 1/0483
257/48
(Continued)

FOREIGN PATENT DOCUMENTS

CH      695 871 A5     9/2006
EP    0 457 472 A1    11/1991
(Continued)

*Primary Examiner* — Vinh Nguyen
(74) *Attorney, Agent, or Firm* — Maschoff Brennan

(57) ABSTRACT

A nest includes a fix part, and a movable part, wherein the fix part and movable part are configured to cooperate so as to define a pocket which can receive at least a part of an electrical component, wherein the movable part is moveable between a first position and a second position, wherein in the first position the pocket is open so that at least part of the electrical component can be moved into the pocket, and in the second position the pocket is closed so that the at least part of the electrical component positioned in the pocket is
(Continued)

secured within the pocket, wherein the nest further includes a biasing means which is arranged to bias the movable part towards its second position. There is further provided a nest assembly, a component handling assembly, and a table that includes the nest.

17 Claims, 6 Drawing Sheets

(51) Int. Cl.
    *G01R 31/26*     (2014.01)
    *G01R 31/28*     (2006.01)

(56) References Cited

U.S. PATENT DOCUMENTS

| | | | |
|---|---|---|---|
| 6,797,936 B1 | 9/2004 | Kessler et al. | |
| 2003/0132770 A1* | 7/2003 | Conroy | G01R 1/0466 324/750.06 |
| 2013/0307549 A1* | 11/2013 | Liu | G01J 1/0252 324/414 |

FOREIGN PATENT DOCUMENTS

| | | |
|---|---|---|
| EP | 0 613 335 A1 | 8/1994 |
| JP | 2001-212246 A | 8/2001 |
| WO | 2010/111590 A2 | 9/2010 |
| WO | 2013/117265 A1 | 8/2013 |

* cited by examiner

ELECTRICAL COMPONENT TESTING NEST

FIELD OF THE INVENTION

The present invention concerns a shaped nest system, and in particular a nest which is suitable for receiving electrical components; and for securing the grasp and position of received electrical components within the nest. The invention also relates to a table, such as a hot-table, which has one or more such nests.

DESCRIPTION OF RELATED ART

To transport components in a component handling assembly each component is usually positioned in a nest. A pocket, which is suitable for receiving a component, is typically provided in each nest. A plurality of such nests is typically provided on a rotative table, such as a hot table. A hot table is a table in which components which are held in the nests on the table are gradually heated to a predefined temperature as the table rotates. The components are heated so that they each have a predefined temperature, which is required for testing, by the time the table has rotated to the position where the component is presented to the testing device for testing. The components are tested while positioned in the nest.

In certain cases the components may become stuck to the testing device during testing; this may occur due to the component having silicon which has melted due to the heating on the hot table; the melted silicon will stick to the testing device. When testing is completed, the testing device is moved away from the nest and the component can be dragged out of the nest, or can become displaced within the nest.

CH695871 discloses a device for the automatic testing of electronic components, comprising a testing station for testing an electronic component and at least one support for holding said electronic component, wherein at least one support holds said electronic component from the lower side and two opposite sides of said electronic component so that the upper surface and contact points on at least two opposite sides of the electronic component are fully accessible when said electronic component is retained on said at least one support.

EP0457472 discloses a socket for mounting an integrated circuit chip to electrically connect chip leads in a test circuit during burn-in testing of the chip has rotably-mounted chip holders and has a plurality of resilient contacts arranged to be movable with forward motion of a reciprocating member to displace the holders and contacts against a bias force to receive the chip in the socket. The holders and contacts are movable with return motion of the reciprocating member to return to their original positions in response to the noted bias to detachably retain the chip in the socket and resiliently engage the contacts with respective chip leads with selected force.

It is an aim of the present invention to obviate, or mitigate, at least some of the above mentioned disadvantages.

BRIEF SUMMARY OF THE INVENTION

According to the present invention, there is provided a nest comprising, a fix part, and a movable part, wherein the fix part and movable part are configured to cooperate so as to define a pocket which can receive at least a part of an electrical component, wherein the movable part is moveable between a first position and a second position, wherein in the first position the pocket is open so that at least part of the electrical component can be moved into the pocket, and in the second position the pocket is closed so that the at least part of the electrical component positioned in the pocket is secured within the pocket, wherein the nest further comprises a biasing means which is arranged to bias the movable part towards its second position.

When the moveable part is moved to its first portion, the dimensions of the pocket are increased, so that a component can be easily moved into the pocket. When the moveable part is moved to its second portion, the dimensions of the pocket are decreased, so that a component is secured within the pocket. When the moveable part is moved to its second portion the pocket is closed; when the pocket is closed the component is secured. The component may be secured by, for example, the component may be clamped between the moveable part and fixed part, the moveable part may comprise an extension which engages or covers a part of the component when the moveable part is in its section position, so that the component is retained in the pocket, the frictional force between the moveable part and component and fixed part and component may be such that the component is retained in the pocket.

The moveable part may be configured so that it can abut an electrical component at least part of which is located in the pocket, to frictionally engage the electrical component, when the moveable part is in its second position, such that frictional force between the moveable part and the component secures the component within the pocket.

The moveable part comprises an extending member which is configured such that it can abut an electrical component at least part of which is located in the pocket, when the moveable part is in its second position, such that frictional force between the extending member and the component secures the component within the pocket.

The moveable part may comprise an extending member which is configured such that it can abut a component located in the pocket, when the moveable part is in its second position, such that the frictional force between the extending member and the component secures the component within the pocket.

The component may be an LED. The fixed part and movable part may be configured to cooperate to define a pocket which is suitable for receiving at least part of an LED.

Preferably the fixed part and movable part are configured to cooperate to define a pocket which is suitable for receiving a part of an LED while leaving another part of the LED exposed for testing. For example, the fixed part and movable part may be configured to cooperate to define a pocket which is suitable for receiving the electrical contacts of an LED while leaving a lens portion of the LED protruding from the pocket so it is exposed for testing.

The fixed part may comprise one or more projections which define one or more walls of the pocket. The fixed part may comprise three projections which define three walls of the pocket.

The moveable part may be configured to define one or more other walls of the pocket. The moveable part may be configured to define a fourth wall of the pocket.

The fixed part may comprise an aperture which can receive the one or more projections which are provided on the fixed part. At least the length dimensions of the aperture may be larger than the length dimensions of the one or more projections on the fixed part so that the moveable part can move relative to the fixed part when the one or more projections on the fixed part are received in the aperture of the moveable part.

The biasing means may comprise at least one flexible blade.

The movable part may be arranged to cooperate with the flexible blade such that movement of the movable part to its first position causes the at least one flexible blade to flex.

The elastic force of the flexed blade will bias the moveable part towards its second position.

The movable part and at least one flexible blade are arranged so that when the moveable part is in the second position the flexible blade is flexed, so that a biasing force is applied to the moveable part when in its second position, so that a component located within the pocket is clamped between the moveable part and fixed part to secure the component in the pocket.

The movable part may comprise one or more projections which is/are arranged to cooperate with the flexible blade such that when the movable part is moved to its first position the projections push against the blade to flex the blade.

Preferably, the one or more projections is/are arranged to abut the flexible blade.

The nest may comprise, a first blade which comprises a first end and second end, wherein the first end is fixed to the fixed part of the nest and a second end which is a free end so that it can flex, and a second blade which comprises a first end and second end, wherein the first end it fixed to the fixed part of the nest and a second end which is a free end so that it can flex.

The movable part may comprise, a first projection which cooperates with the first blade proximate to the free end of the first blade, and a second projection which cooperates with the second blade proximate to the free end of the second blade, so that movement of the moveable part towards its first position will cause flexion of the first and second blades.

The nest may comprise a flexible blade which is configured to be secured to the fixed portion at a centre point along the length of the blade, leaving the ends of the blade free to flex. one or more projections on the moveable part may be arranged to cooperate with the blade at a position which is proximate to the ends of blade which are free to flex.

The nest may further comprise a guide means which can guide the movement of the movable part as it moves between the first and second positions. Preferably, the guide means comprises one or more projection members on the fixed which engage one or more tracks on the moveable part. Alternatively the guide means may comprise one or more projection members on the moveable part which engage one or more tracks on the fixed part. It will be understood that any suitable guide means could be used.

The nest may further comprise a heating means, which is configured to be in thermal communication with the pocket such that the heating means can heat a component held in the pocket. Preferably the heating means comprises one or more heating elements which are integrated within the nest.

The moveable part may further comprise a surface which is arrangeable to cooperate with a cam of an actuator so that movement of the cam can effect movement of the moveable part between its first and second positions. Preferably, the moveable part comprises a ledge, which extends beyond an edge of the fixed part, and wherein the ledge comprises a surface which is suitable for cooperating with a cam of an actuator, so that movement of the cam will effect movement of the moveable part between its first and second positions. The surface which is suitable for cooperating with a cam of an actuator is preferably a side face of the ledge. The side face of the ledge is preferably substantially horizontal.

According to a further aspect of the present invention there is provided a method for securing a component in a nest according to any one of the above-mentioned nests, comprising the step of, moving the moveable part to its first position against the biasing means, positioning at least part of a component into the pocket, moving the moveable part to its second position using the biasing means so that the component, at least part of which is located in the pocket, is secured within the pocket.

Preferably, the method comprises moving the moveable part to its second position using the biasing means so an extending member on the moveable part abuts the component located in the pocket, so that frictional forces between the extending member and the component secures the component within the pocket. The method may comprise moving the moveable part to its second position so that frictional forces between the extending member and the component, and between the fixed portion and the component, secures the component within the pocket The method may comprise the step of apply a biasing force to the movable part using the biasing means so that the component is clamped between the moveable part and fixed part to secure the component within the pocket.

According to a further aspect of the present invention there is provided a nest assembly comprising at least one nest according to any one of the above-mentioned nests, and at least one actuator, wherein the actuator comprises a cam in the form of an eccentric cam which is arranged to cooperate with a surface of the moveable part of the nest, so that rotation of the cam will effect movement of the moveable part between its first and second positions and wherein the actuator further comprises a motor which is operable to rotate the cam. The motor may be a stepper motor.

A plurality of nest may be provided on a rotatable table, wherein the table is configured to be rotate intermittently, and a plurality of actuators each of which are arranged in a fixed position and located proximate to the periphery of the table so that the cam of each actuator can cooperate with a surface of the moveable part of a corresponding nest so that rotation of the cam will effect movement of the moveable part of the corresponding nest between its first and second positions.

According to a further aspect of the present invention there is provided a table comprising a nest according to any one of the above-mentioned nests. The table may comprise a plurality of any one of the above-mentioned nests.

The table may be a hot table wherein the components held in the nests are heated. Preferably, the components are heated gradually as the table rotates such that the components are heated to a predefined temperature before reaching a predefined position. The table may be located in a heating chamber. The table may comprise integral heating means which is configured to heat components secured in the nests of the table.

According to a further aspect of the present invention there is provided a component handling assembly comprising a nest assembly according to any one of the above-mentioned nest assemblies, an LED testing device which is configured to operably cooperate with an LED, while the LED is secured in the pocket of the nest, to allow testing of the LED.

BRIEF DESCRIPTION OF THE DRAWINGS

The invention will be better understood with the aid of the description of an embodiment, which is given by way of example only, and illustrated by the figures, in which.

DETAILED DESCRIPTION OF POSSIBLE EMBODIMENTS OF THE INVENTION

Figure 1:
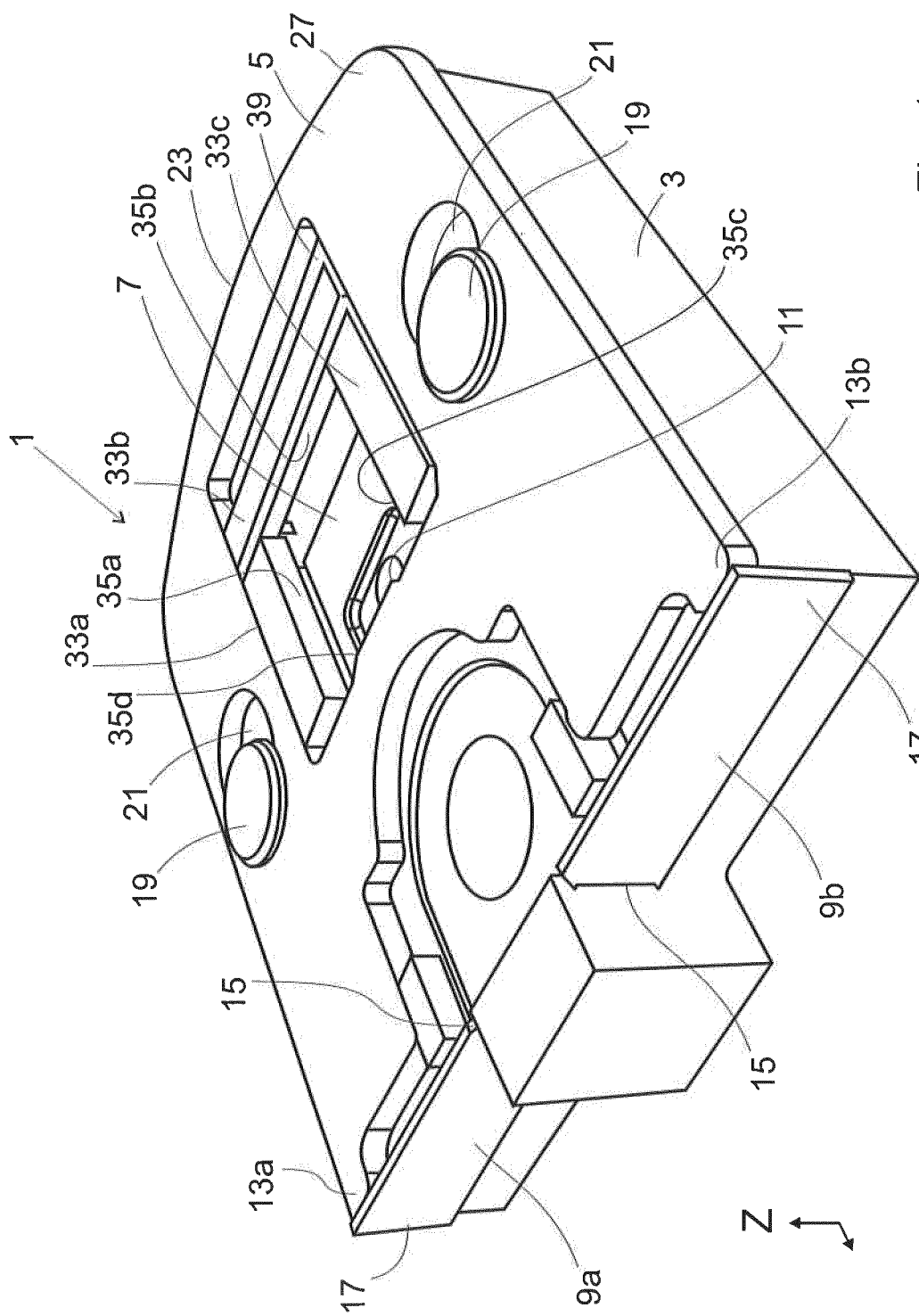
FIG. 1 shows a perspective view of a nest according to one embodiment of the present invention.
Figure 2:
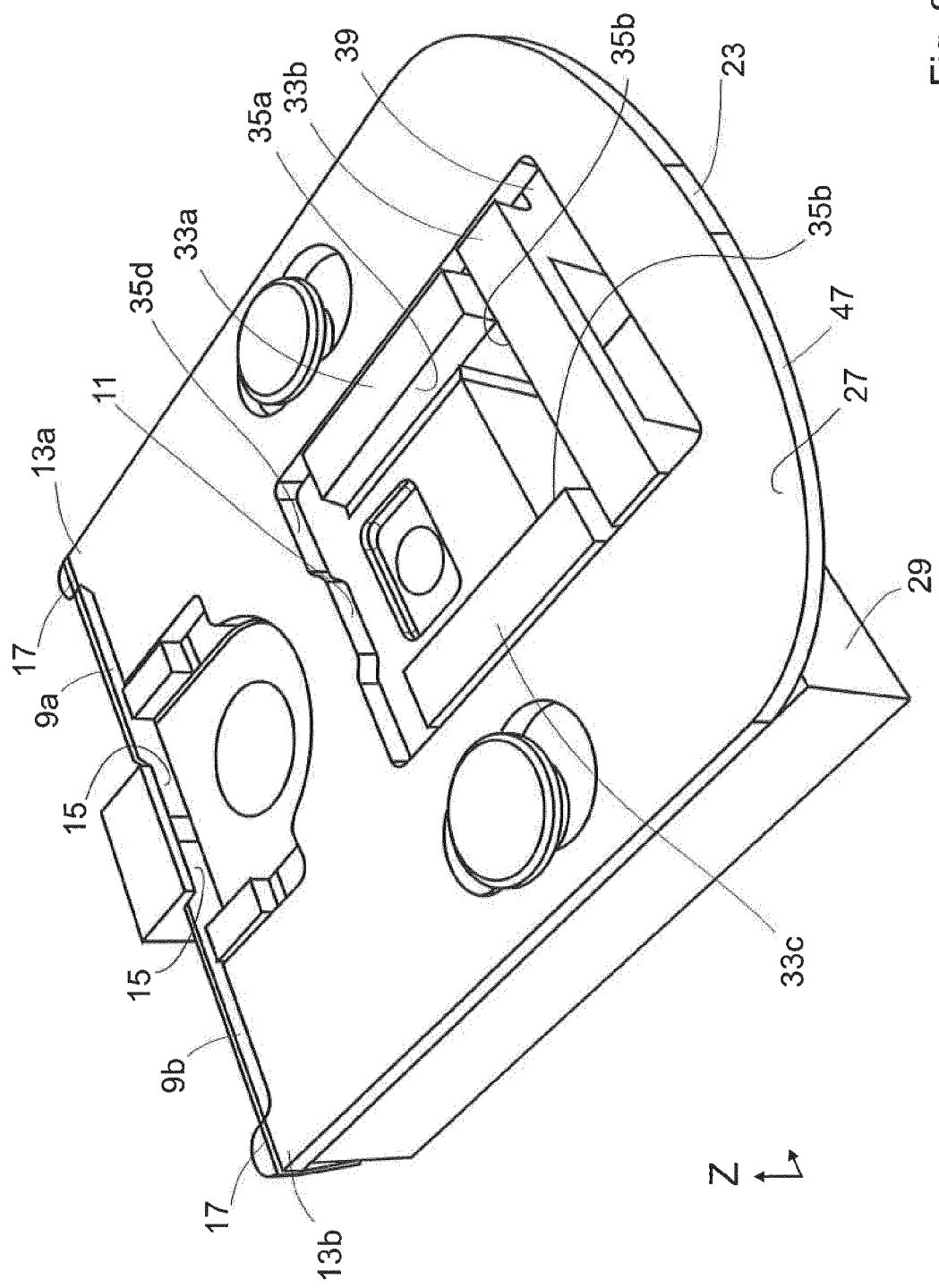
FIG. 2 shows a further perspective view of the nest shown in FIG. 1.
Figure 3:
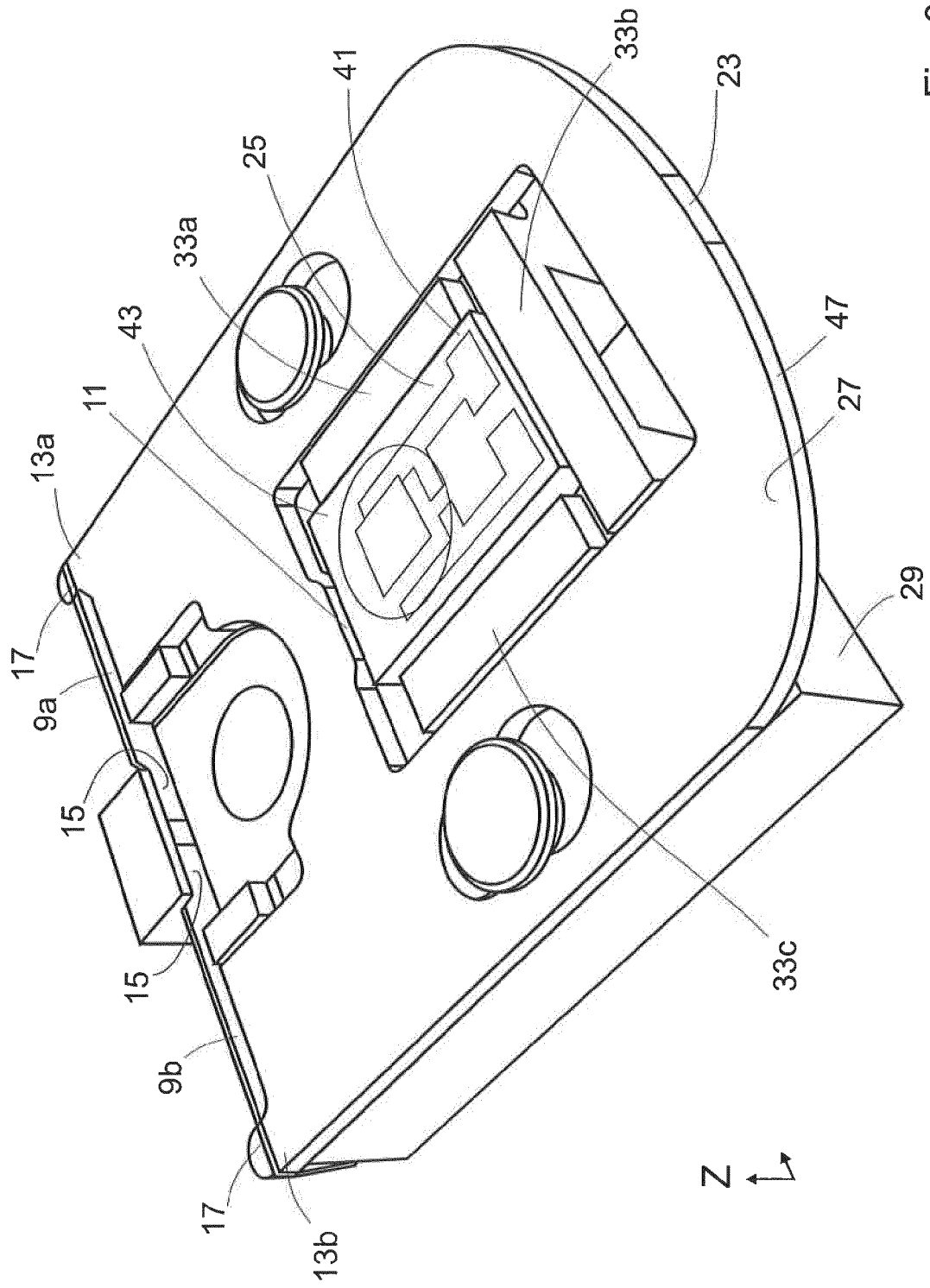
FIG. 3 shows a further perspective view of the nest shown in FIG. 1, with a component secured in the nest.

Referring to FIGS. 1-3, there is shown perspective views of a nest 1 according to one embodiment of the present invention. The nest 1 comprises a fixed part 3 and a movable part 5, wherein the fixed part 3 and movable part 5 are configured to cooperate so as to define a pocket 7. The pocket 7 is suitable for receiving an electrical component such as an LED, or at least part of an electrical component.

The fixed part 3 comprises three members 33a-c which define three walls 35a-c of the pocket 7; the moveable member 5 defines a fourth wall 35d of the pocket 7. The three members 33a-c are arranged to protrude through a recess 39 provided in the moveable member 5; the recess 39 is dimensioned to extend longer than the three walls 35a-c so as to permit the moveable member 5 to move relative to the fixed part 3.

The movable part 5 is moveable between a first position and a second position. FIG. 2 illustrates the movable part 5 in its first position; when the movable part 5 is in the first position the dimensions of the pocket 7 are at a maximum so that an electrical component can be easily moved into the pocket 7. When the movable part 5 is in the first position the pocket 7 is "open". FIG. 3 illustrates the movable part 5 in its second position; when the movable part 5 is in the second position the dimensions of the pocket 7 are at a minimum so that at least the length dimension of the pocket 7 matches the length of a electrical component positioned within the pocket 7, so that the electrical component positioned within the pocket 7 is secured. When the movable part 5 is in the second position the pocket 7 is "closed".

FIG. 3 shows an electrical component, in the form of an LED 25 secured within the pocket 7. The pocket 7 is suitable for receiving electrical contacts 41 of the LED 25 while leaving a lens 43 portion of the LED 25 protruding from the pocket 7 so it is exposed for testing.

The part of the moveable part 5 which defines the fourth wall 35d of the pocket 7 comprises an extending member 11 which is configured such that it can abut the LED 25 located in the pocket 7, when the moveable part 5 is in its second position. When the extending member 11 abuts the LED 25 located in the pocket 7, frictional forces between the extending member 11 and the LED 25 and between the LED 25 and the three members 33a-c of the fixed portion 3, secures the LED 25 within the pocket 7.

The nest 1 further comprises a biasing means in the form of first and second flexible blades 9a,b which are arranged to bias the movable part 5 towards its second position. The first blade 9a comprises a first end 15 and second end 17; the first end 15 is fixed to the fixed part 3 of the nest 1 and the second end 17 is a free end so that it can flex. The second blade 9b also comprises a first end 15 and second end 17, wherein the first end 15 is fixed to the fixed part 3 of the nest 1 and a second end 17 is a free end so that it can flex.

The movable part 5 is arranged to cooperate with the first and second flexible blades 9a,b such that movement of the movable part 5 to its first position causes the first and second flexible blades 9a,b to flex. The movable part 5 comprises two projections 13a,b each of which is arranged to abut with first and second flexible blades 9a,b respectively. The first projection 13a abuts with the first blade 9a at a position which is proximate to the free end 17 of the first blade 9a, and a second projection 13b abuts the second blade 9b at a position which is proximate to the free end 17 of the second blade 9a, so that movement of the moveable part 5 towards its first position will cause flexion of the first and second blades 9a,b. The elastic force of flexed first and second flexible blades 9a,b will bias the moveable part 5 towards its second position.

Also, optionally, the movable part 5 and first and second flexible blades 9a,b may be arranged so that when the moveable part 5 is in its second position the first and second flexible blades 9a,b are flexed, so that a biasing force is applied to the moveable part 5 when in the moveable part 5 is in its second position. Applying a biasing force to the moveable part 5 when it is in its second position, will enable clamping of a component/LED 25 which is located within the pocket 7, between the moveable part 5 and fixed part 3; clamping of the component/LED 25 will ensure that it is held more securely within the pocket 7.

The nest 1 further comprises a guide means 19,21 which can guide the movement of the movable part 5 as it moves between the first and second positions. In this particular example the guide means 19,21 comprises two projection members 19 which are fixed to the fixed part 3 of the nest 1, and two tracks 21 which are provided in the moveable part 5. The projection members 19 engage the tracks 21, and move along the tracks 21 as the moveable member 5 moves between the first and second positions. It will be understood that any number of projection members 19 and tracks 21 could be provided. It will be understood that any suitable guide means could be used; for example, it will be understood that alternatively the guide means may comprise one or more projection members 19 on the moveable part 5 which engage one or more tracks 21 on the fixed part 3.

The nest 1 further comprises a heating means (not shown), which is configured to be in thermal communication with the pocket 7 such that the heating means can heat the LED 25 located in the pocket 7. Preferably, the heating means comprises one or more heating elements (not shown) which are integrated within the nest 1.

The moveable part 3 further comprises a ledge 27, which extends beyond an end 29 of the fixed part 3. The ledge 27 comprises a surface 23 which is suitable for cooperating with a cam of an actuator (not shown), so that movement of the cam will effect movement of the moveable part 5 between its first and second positions. As can be seen from FIGS. 2 and 3 the surface 23 which is suitable for cooperating with a cam of an actuator is provided on a face 47 of the ledge 27; and the surface 23 is configured to be substantially horizontal.

Figure 4:
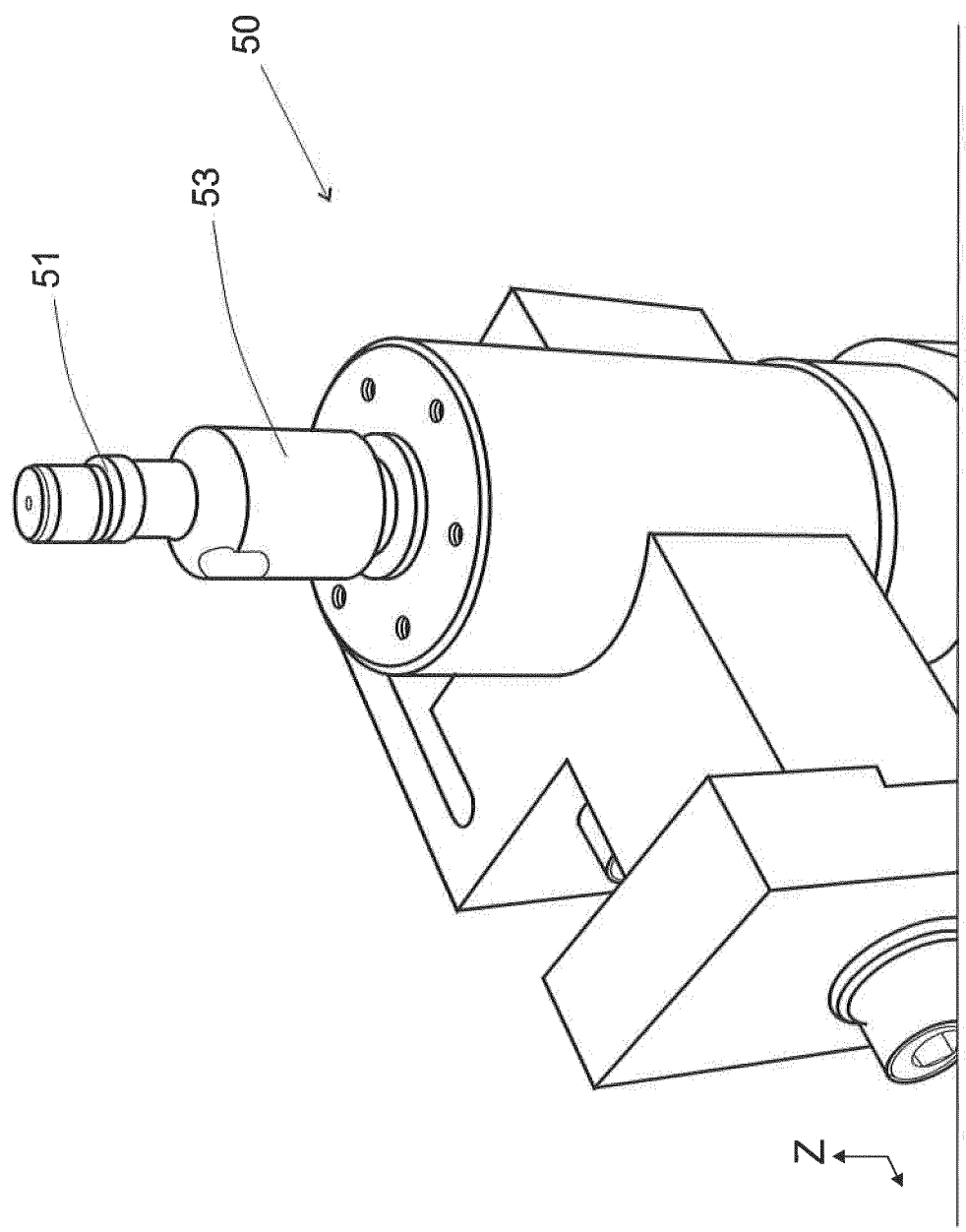
FIG. 4 shows a perspective view of an actuator which can cooperate with the nest shown in FIGS. 1-3 to move the moveable part of the nest.

FIG. 4 provides a perspective view of an actuator 50 which is suitable for cooperating with the nest 1 shown in FIGS. 1-3 to move the moveable member 5 between its first and second positions. The actuator 50 comprises a cam 51, in the form of an eccentric disc 51, which is arrangeable to abut with the surface 23 of the moveable part 5 of the nest 1, so that rotation of the cam 51 will effect movement of the moveable part 5 between its first and second positions.

The actuator 50 further comprises a motor 53 which is operable to rotate the cam 51. The motor 53 is preferably a stepper motor.

The actuator 50 shown in FIG. 4 may be arranged to cooperate with the nest 1 shown in FIGS. 1-3 to form a nest assembly. The actuator 50 should be arranged so that its cam 51, which in this case is in the form of an eccentric disc 51, abuts with the surface 23 of ledge 27 of the of the moveable part 5. As the eccentric disc 51 rotates it will effect movement of the moveable part 5 between its first and second positions.

Figure 5:
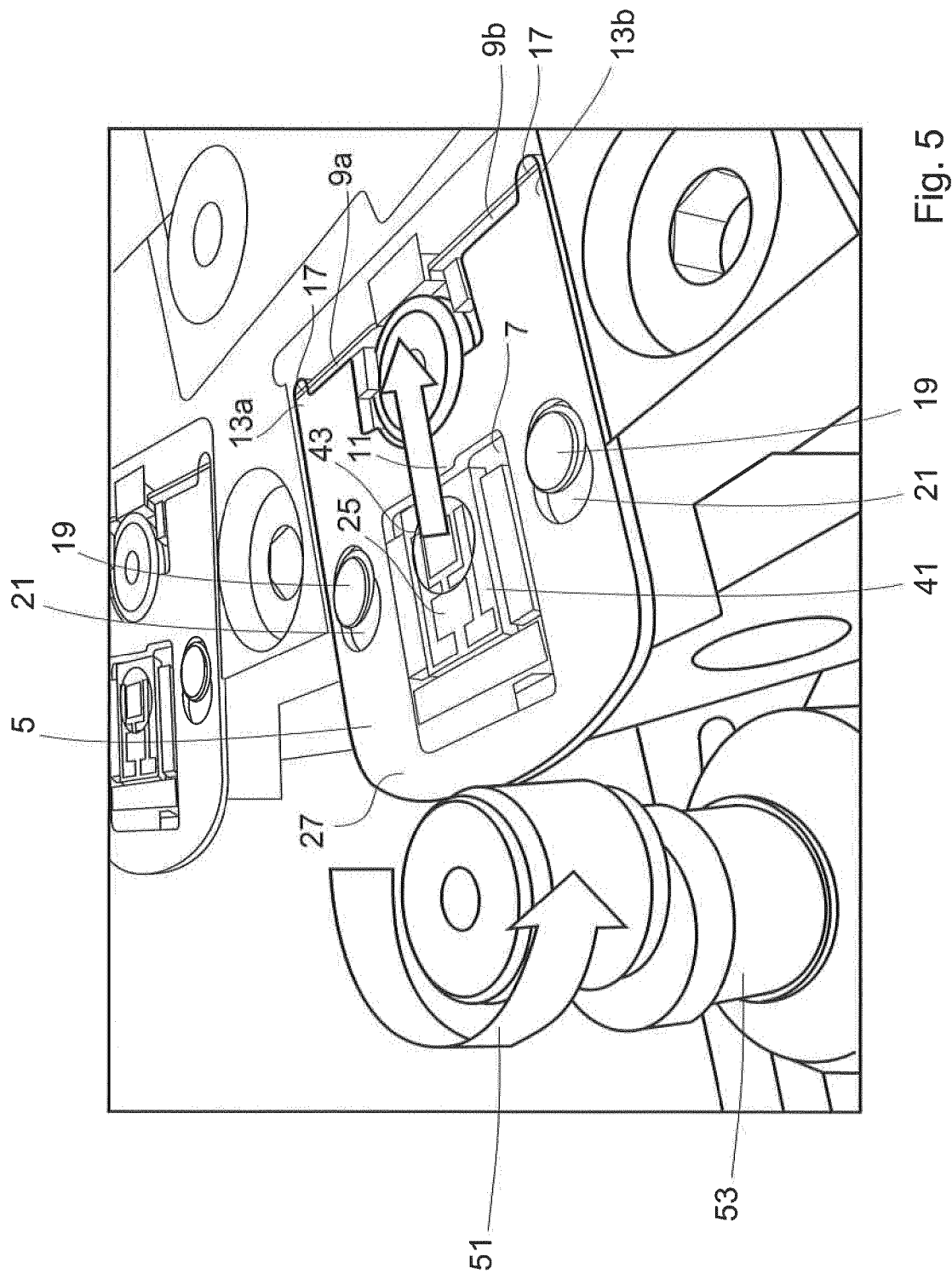
FIGS. 5 and 6 illustrate the operation of a nest as shown in FIGS. 1-3 and the operation an actuator 50 as shown in FIG. 4.
Figure 6:
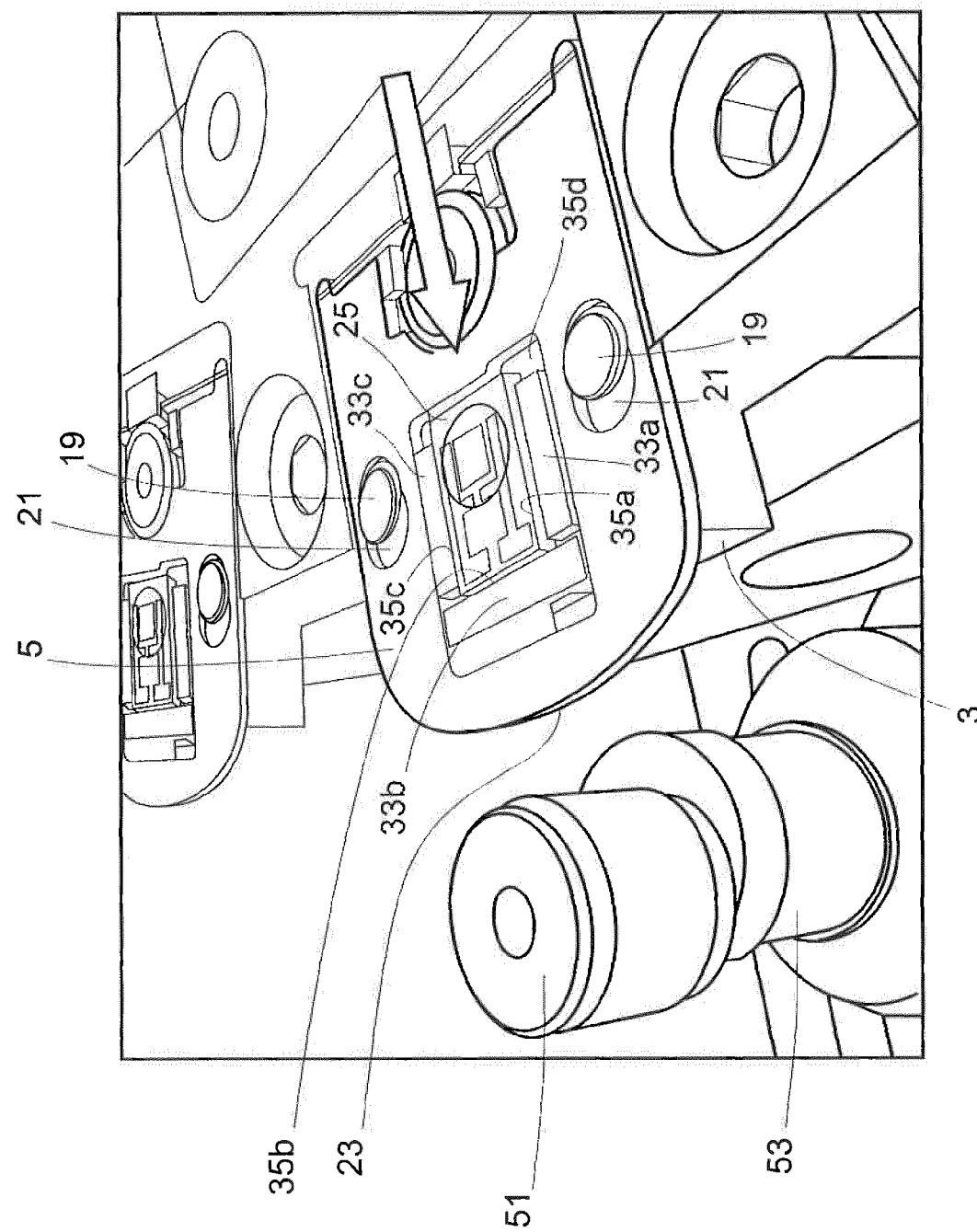

FIGS. 5 and 6 illustrate the operation of a nest as shown in FIGS. 1-3 and a actuator 50 as shown in FIG. 4.

During use, the motor 53 of the actuator 50 operates to rotate the eccentric disc 51 so that the eccentric disk 51 abuts the surface 23 on the ledge 27 of the movable part 5. The rotating eccentric disc 51 pushes the movable part 5 of the nest 1 towards its first position so that the pocket 7 opens. When the moveable part 5 is moved to its first portion, the dimensions of the pocket 7 are increased, so that an LED 25 can be easily moved into the pocket 7.

An LED 25 is then arranged so that its electrical contacts 41 are positioned within the pocket 7, while leaving the lens 43 portion of the LED 25 protruding from the pocket 7 so it is exposed for testing.

As the movable part 5 of the nest 1 is moved towards its first position the two projections 13*a,b*, each of which abuts with first and second flexible blades 9*a,b* respectively, push on the free ends 17 of the first and second flexible blades 9*a,b* to cause flexion of the blades 9*a,b*. The elastic force of the flexed first and second flexible blades 9*a,b* will bias the moveable part 5 towards its second position.

Once the LED 25 has been positioned within the pocket 7, the motor 53 of the actuator 50 is operated to rotate the eccentric disc 51 so that eccentric disk 51 no longer abuts the surface 23 on the ledge 27 of the movable part 5. Simultaneously, the biasing force of the flexed first and second flexible blades 9*a,b*, moves the movable part 5 to its second position.

When the movable part 5 is in its second position, the extending member 11 (visible in FIG. 5 but not visible in FIG. 6), which is located on the part of the moveable part 5 which defines the fourth wall 35*d* of the pocket 7, abuts the LED 25 located in the pocket 7. The LED 25 will also abut the three walls 35*a-c* defined by the three members 33*a-c* provided on the fixed part 3. Frictional forces which exist between the extending member 11 and the LED 25, and between the LED 25 and the three members 33*a-c* of the fixed portion 3, secures the LED 25 within the pocket 7. Thus, when the moveable part 5 is moved to its second portion, the dimensions of the pocket 7 are decreased, so that a LED 25 is secured, by friction, within the pocket 7.

Optionally, if the movable part 5*a* and first and second flexible blades 9*a,b* are arranged so that when the moveable part 5 is in the second position first and second flexible blades 9*a,b* are flexed, the component/LED 25 will be clamped, between the moveable part 5 and fixed part 3; clamping of the component/LED 25 will ensure that it is held more securely within the pocket 7.

The two projection members 19 which are fixed to the fixed part 3, move along the tracks 21 which are provided in the movable part 5, as the moveable part 5 moves between its first and second positions. Thus, the cooperation of the projection members 19 and tracks 21 guide the movement of the movable part 5; for example their cooperation prevents rotation of the moveable part 5 with respect to the fixed part 5.

Once the LED 25 has been arranged within the pocket 7, a heating means which is configured to be in thermal communication with the pocket 7, may be operated to heat the LED 25 to a desired temperature required for testing.

Also the above mentioned nests 1 shown in FIGS. 1-3 facilitate the execution of a new method for securing a components 35 in a nest 1, the method comprising the steps of, moving the moveable part 5 to its first position against a biasing force provided by a biasing means 9*a,b*, to open a pocket; positioning at least part of a component 35 into the pocket 7; moving the moveable part 5 to its second position using the biasing means 9*a,b* so that the component 25 positioned in the pocket 7 is secured within the pocket 7.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

For example, alternatively, or additionally, the nest 1 may comprise a flexible blade which is configured to be secured to the fixed portion 3 at a centre point along the length of the blade, leaving the ends of the blade free to flex. The two projections 13*a,b* on the moveable part may be arranged to cooperate with the blade at a position which is proximate to the ends of blade which are free to flex.

It will be understood that a plurality of the nests 1 shown in FIGS. 1-3 may be provided on a table e.g a hot table. The table may be configured to rotate intermittently. A plurality of actuators 50, as shown in FIG. 4, may be arranged at fixed positions, proximate to the periphery of the table, so that the cams 51 of each actuator 50 can cooperate with a surface 23 on a corresponding nest 1.

Once or more nests 1, as shown in FIGS. 1-3, and one or more actuators 50, as shown in FIG. 4, may be arranged in cooperation to form a nest assembly. A component handling assembly may also be provided, comprising the above-mentioned nest assembly and, an LED testing device which is configured to operably cooperate with the LED to allow testing of an LED, while the LED is secured within the pocket 7 of the nest 1. The LED testing device may be configured to operably cooperate with a lens of the LED which remains external to the pocket 7 when the LED is secured within the pocket 7.

The invention claimed is:
1. A nest comprising:
   a fix part,
   a movable part, wherein:
      the fix part and movable part are configured to cooperate so as to define a pocket which can receive at least a part of an electrical component,
      the movable part is moveable between a first position and a second position, wherein in the first position the pocket is open so that at least part of the electrical component can be moved into the pocket, and in the second position the pocket is closed so that the at least part of the electrical component positioned in the pocket is secured within the pocket; and
   biasing means which is arranged to bias the movable part towards its second position, wherein the biasing means is configured to automatically move the movable part from its first position towards its second position, wherein the biasing means comprises one or more flexible blades, wherein moving the moveable part towards its first position so that at least a part of the electrical component can be moved into the pocket causes flexion of the one or more flexible blades, and wherein the moveable part can be automatically moved towards its second position by elastic return of the flexed one or more flexible blades.

2. A nest according to claim 1 wherein the moveable part is configured so that it can abut an electrical component at least part of which is located in the pocket, to frictionally engage the electrical component, when the moveable part is in its second position, such that frictional force between the moveable part and the component secures the component within the pocket.

3. A nest according to claim 1 wherein the moveable part comprises an extending member which is configured such that it can abut an electrical component at least part of which is located in the pocket, when the moveable part is in its second position, such that frictional force between the extending member and the component secures the component within the pocket.

4. A nest according to claim 1 wherein the fixed part and movable part are configured to cooperate to define a pocket which is suitable for receiving at least part of an LED.

5. A nest according to claim 1 wherein the movable part is arranged to cooperate with the one or more flexible blades such that movement of the movable part to its first position causes the one or more blades is to flex.

6. A nest according to claim 1 wherein the movable part comprises one or more projections which is/are arranged to cooperate with one or more flexible blades such that when the movable part is moved to its first position the projections push against the one or more blades to flex the one or more blades.

7. A nest according to claim 1 comprising a first blade which comprises a first end and second end, wherein the first end is fixed to the fixed part of the nest and the second end is a free end so that it can flex, and a second blade 9b which comprises a first end and second end, wherein the first end it fixed to the fixed part of the nest and a second end is a free end so that it can flex.

8. A nest according to claim 7 wherein the movable part comprises a first projection which cooperates with the first blade at a position which is proximate to the free end of the first blade, and a second projection which cooperates with the second blade at a position which is proximate to the free end of the second blade, so that movement of the moveable part towards its first position will cause flexion of the first and second blades.

9. A nest according to claim 1 further comprising a guide means which can guide the movement of the movable part as it moves between the first and second positions.

10. A nest according to claim 1 wherein the nest further comprises a heating means, which is configured to be in thermal communication with the pocket such that the heating means can heat an electrical component held in the pocket.

11. A nest according to claim 1 wherein the moveable part further comprises a surface which is arrangeable to cooperate with a cam of an actuator so that movement of the cam can effect movement of the moveable part between its first and second positions.

12. A method for securing a component in a nest according to claim 1, comprising:
moving the moveable part to its first position against a force of the biasing means,
positioning at least part of an component into the pocket, and
moving the moveable part to its second position using a biasing force of the biasing means so that the moveable part abuts the component to frictionally engage the component to secure the component within the pocket.

13. A nest assembly comprising:
at least one nest according to claim 1; and
at least one actuator, wherein the actuator comprises a cam in the form of an eccentric disc which is arranged to cooperate with a surface of the moveable part of the nest, so that rotation of the cam will effect movement of the moveable part between its first and second positions and wherein the actuator further comprises a motor which is operable to rotate the cam.

14. A table comprising a nest according to claim 1.

15. A component handling assembly comprising a nest assembly according to claim 13, an LED testing device which is configured to operably cooperate with an LED secured in the pocked of the nest, to allow testing of the LED.

16. A nest comprising:
a fix part,
a movable part, wherein:
the fix part and movable part are mechanically attached to one another, and are configured to cooperate so as to define a pocket which can receive at least a part of an electrical component,
the movable part is moveable between a first position and a second position, wherein in the first position the pocket is open so that at least part of the electrical component can be moved into the pocket, and in the second position the pocket is closed so that the at least part of the electrical component positioned in the pocket is secured within the pocket, and wherein the fixed part and moveable part are mechanically attached when the moveable part is in the first position and when the moveable part is in the second position, and
biasing means which is arranged to bias the movable part towards its second position, wherein:
the biasing means is configured to automatically move the movable part from its first position towards its second position,
the biasing means comprises one or more flexible blades,
moving the moveable part towards its first position so that at least a part of the electrical component can be moved into the pocket causes the moveable part to move against the one or more flexible blades to flex the one or more flexible blades such that with the movable part in the first position the one or more flexible blades is flexed, and
the moveable part is automatically moved towards its second position by elastic return of the flexed one or more flexible blades acting on the moveable part.

17. A nest according to claim 1, wherein:
each of the one or more flexible blades includes a first end fixed to the fix part and a second end that is free to flex relative to the first end; and
the second end is in direct contact with a projection of the movable part both when the movable part is in the first position and when the movable part is in the second position.

* * * * *